United States Patent
Chae

(10) Patent No.: US 11,967,398 B2
(45) Date of Patent: Apr. 23, 2024

(54) SEMICONDUCTOR DEVICE DELAYING MODE CONTROL SIGNALS

(71) Applicant: SK hynix Inc., Icheon-si Gyeonggi-do (KR)

(72) Inventor: Haeng Seon Chae, Icheon-si Gyeonggi-do (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 148 days.

(21) Appl. No.: 17/747,335

(22) Filed: May 18, 2022

(65) Prior Publication Data

US 2023/0290394 A1   Sep. 14, 2023

(30) Foreign Application Priority Data

Mar. 14, 2022   (KR) .......................... 10-2022-0031719

(51) Int. Cl.
*G11C 7/22*   (2006.01)
*G11C 7/10*   (2006.01)

(52) U.S. Cl.
CPC ............ *G11C 7/222* (2013.01); *G11C 7/1051* (2013.01); *G11C 7/1072* (2013.01)

(58) Field of Classification Search
CPC ..... G11C 7/222; G11C 7/1051; G11C 7/1072; G11C 7/1039; G11C 7/22; G11C 7/1045; G11C 7/1078; G11C 2207/2254
See application file for complete search history.

(56) References Cited

U.S. PATENT DOCUMENTS

| | | | |
|---|---|---|---|
| 10,324,490 B2 | 6/2019 | Mozak | |
| 2012/0113728 A1* | 5/2012 | Kwon | G11C 7/1087 365/189.05 |
| 2013/0329504 A1* | 12/2013 | Onishi | G11C 7/1066 365/189.05 |
| 2019/0348094 A1* | 11/2019 | Park | G06F 3/0634 |
| 2020/0098404 A1* | 3/2020 | Kim | G11C 7/1087 |
| 2022/0059143 A1* | 2/2022 | Kim | G11C 29/023 |

FOREIGN PATENT DOCUMENTS

KR   100242759 B1   2/2000

* cited by examiner

*Primary Examiner* — Jerome Leboeuf
(74) *Attorney, Agent, or Firm* — William Park & Associates Ltd.

(57) ABSTRACT

A semiconductor device may include: a mode input control signal generation circuit configured to generate a control pulse when a mode control operation is performed, generate a mode input control signal by delaying the control pulse by a mode delay period, and control the mode delay period on the basis of a restart signal; a read strobe signal generation circuit configured to generate a read strobe signal on the basis of the control pulse; a read delay circuit configured to generate the read input control signal by delaying the read strobe signal by a read delay period; and a read pipe circuit configured to receive mode data on the basis of the mode input control signal, and receive cell data on the basis of the read input control signal.

18 Claims, 14 Drawing Sheets

SEMICONDUCTOR DEVICE DELAYING MODE CONTROL SIGNALS

CROSS-REFERENCES TO RELATED APPLICATIONS

The present application claims priority under 35 U.S.C. § 119(a) to Korean application number 10-2022-0031719, filed in the Korean Intellectual Property Office on Mar. 14, 2022, the entire disclosure of which is incorporated herein by reference in its entirety.

BACKGROUND

1. Technical Field

Various embodiments of the present disclosure relate to a semiconductor device, and more particularly to a semiconductor device related to a mode resister read operation.

2. Related Art

A semiconductor device includes a mode register, and provides a mode register write operation and a mode register read operation. The semiconductor device may store various pieces of information, including operation information and setting information, in a mode register through the mode register write operation, and output the information stored in the mode register through the mode register read operation.

SUMMARY

In an embodiment, a semiconductor device may include: a mode input control signal generation circuit configured to generate a control pulse when a mode control operation is performed, generate a mode input control signal by delaying the control pulse by a mode delay period, and control the mode delay period on the basis of a restart signal which is generated at a point of time that a restart period has elapsed from a point of time that the mode input control signal was generated; a read strobe signal generation circuit configured to generate a read strobe signal on the basis of the control pulse; a read delay circuit configured to generate a read input control signal by delaying the read strobe signal by a read delay period; and a read pipe circuit configured to receive mode data on the basis of the mode input control signal, and receive cell data on the basis of the read input control signal.

In another embodiment, a semiconductor device may include: a control pulse generation circuit configured to generate a control pulse when a mode control operation is performed; a mode delay circuit configured to set a mode delay period on the basis of a delay select signal, and generate a mode input control signal by delaying the control pulse by the mode delay period; a read strobe signal generation circuit configured to generate a read strobe signal on the basis of the control pulse; a read delay circuit configured to generate a read input control signal by delaying the read strobe signal by a read delay period; and a read pipe circuit configured to receive mode data on the basis of the mode input control signal, and receive cell data on the basis of the read input control signal.

DETAILED DESCRIPTION

In the descriptions of the following embodiments, the term "preset" indicates that the value of a parameter is previously decided, when the parameter is used in a process or algorithm. According to an embodiment, the value of the parameter may be set when the process or algorithm is started or while the process or algorithm is performed.

Terms such as "first" and "second," which are used to distinguish among various components, are not limited by the components. For example, a first component may be referred to as a second component, and vice versa.

When one component is referred to as being "coupled" or "connected" to another component, it should be understood that the components may be directly coupled or connected to each other or coupled or connected to each other through another component interposed therebetween. On the other hand, when one component is referred to as being "directly coupled" or "directly connected" to another component, it should be understood that the components are directly coupled or connected to each other without another component interposed therebetween.

"Logic high level" and "logic low level" are used to describe the logic levels of signals. A signal having a "logic high level" is distinguished from a signal having a "logic low level." For example, when a signal having a first voltage corresponds to a "logic high level," a signal having a second voltage may correspond to a "logic low level." According to an embodiment, a "logic high level" may be set to a voltage higher than a "logic low level." According to an embodiment, the logic levels of signals may be set to different logic levels or opposite logic levels. For example, a signal having a logic high level may be set to have a logic low level according to an embodiment, and a signal having a logic low level may be set to have a logic high level according to an embodiment.

A "logic bit set" may indicate a combination of logic levels of bits contained in a signal. When the logic levels of the bits contained in the signal are changed, the logic bit set of the signal may be differently set. For example, when two bits are contained in a signal, the logic bit set of the signal may be set to a first logic bit set, in case that the logic levels of the two bits contained in the signal are "logic low level, logic low level," and the logic bit set of the signal may be set to a second logic bit set, in case that the logic levels of the two bits contained in the signal are "logic low level, logic high level."

Hereafter, teachings of the present disclosure will be described in more detail through embodiments. The embodiments are used to provide examples of the teachings of the present disclosure, and the scope of the present disclosure is not limited by the embodiments.

Figure 1:
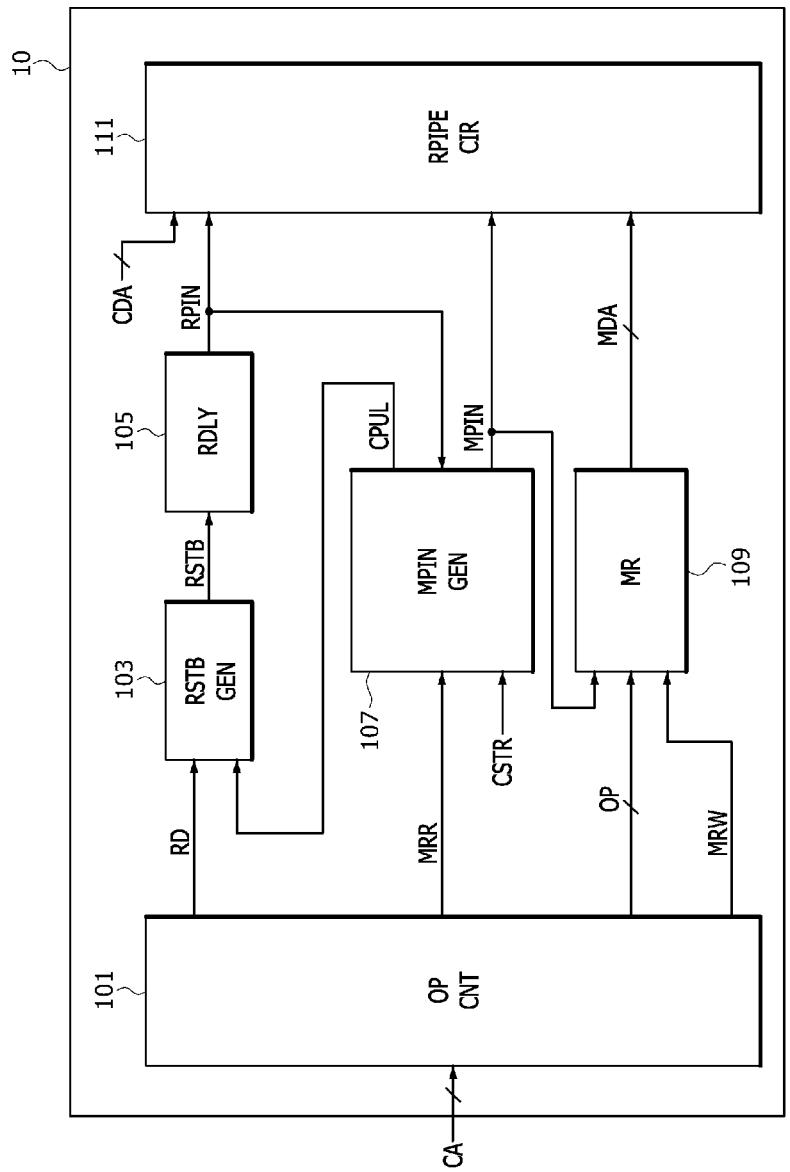
FIG. 1 is a block diagram illustrating the configuration of a semiconductor device in accordance with an embodiment.

FIG. 1 is a block diagram illustrating the configuration of a semiconductor device 10 in accordance with an embodiment. As illustrated in FIG. 1, the semiconductor device 10 may include an operation control circuit (OP CNT) 101, a read strobe signal generation circuit (RSTB GEN) 103, a read delay circuit (RDLY) 105, a mode input control signal generation circuit (MPIN GEN) 107, a mode register (MR) 109, and a read pipe circuit (RPIPE CIR) 111.

The operation control circuit 101 may receive an external control signal CA from an external device (not illustrated) of the semiconductor device 10. The external device (not illustrated) of the semiconductor device 10 may be a controller (201 of FIG. 11). The external control signal CA may include one or more of a command and an address. The operation control circuit 101 may generate a read command RD, a mode register read command MRR, and a mode register write command MRW by decoding the external control signal CA. The read command RD may be generated for a read operation in which cell data CDA is output from a cell block (not illustrated). The mode register read command MRR may be generated for a mode register read operation of outputting, as mode data MDA, an information signal OP stored in the mode register 109. The mode register write command MRW may be generated for a mode register write operation of storing the information signal OP in the mode register 109. The operation control circuit 101 may extract the information signal OP from the external control signal CA during the mode register write operation.

The read strobe signal generation circuit 103 may be coupled to the operation control circuit 101, the read delay circuit 105, and the mode input control signal generation circuit 107. The read strobe signal generation circuit 103 may receive the read command RD from the operation control circuit 101, and receive a control pulse CPUL from the mode input control signal generation circuit 107. The read strobe signal generation circuit 103 may generate a read strobe signal RSTB when the read command RD or the control pulse CPUL is generated. The read strobe signal generation circuit 103 may apply the read strobe signal RSTB to the read delay circuit 105.

The read delay circuit 105 may be coupled to the read strobe signal generation circuit 103, the mode input control signal generation circuit 107, and the read pipe circuit 111. The read delay circuit 105 may receive the read strobe signal RSTB from the read strobe signal generation circuit 103. The read delay circuit 105 may generate a read input control signal RPIN by delaying the read strobe signal RSTB by a read delay period. The read delay period of the read delay circuit 105 may be set to various values in different embodiments. The read delay circuit 105 may apply the read input control signal RPIN to the mode input control signal generation circuit 107 and the read pipe circuit 111.

Figure 2:
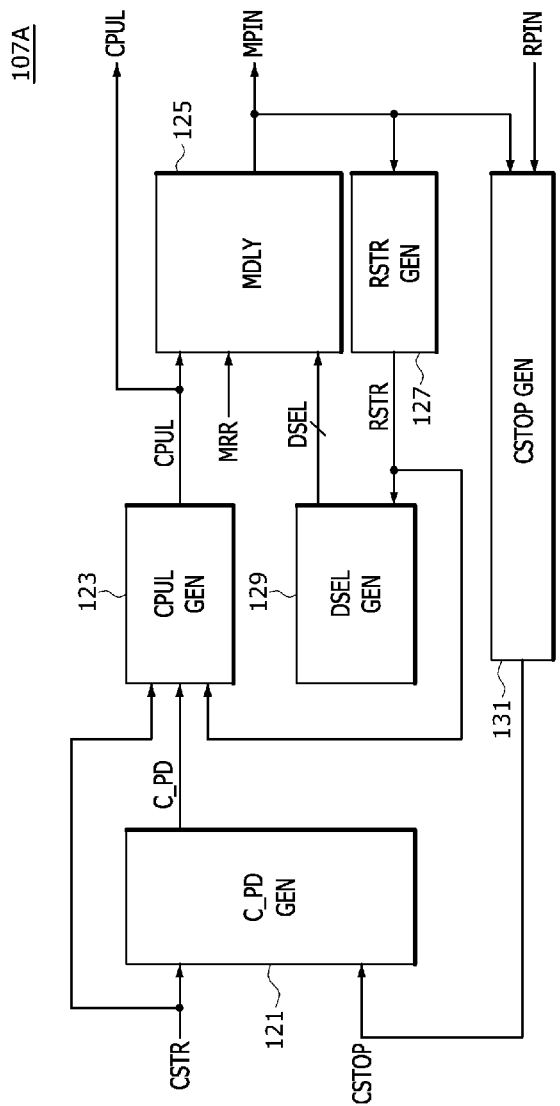
FIG. 2 is a block diagram illustrating the configuration of a mode input control signal generation circuit in accordance with an embodiment.

The mode input control signal generation circuit 107 may be coupled to the operation control circuit 101, the read strobe signal generation circuit 103, the read delay circuit 105, the mode register 109, and the read pipe circuit 111. The mode input control signal generation circuit 107 may receive the mode register read command MRR from the operation control circuit 101, and receive the read input control signal RPIN from the read delay circuit 105. The mode input control signal generation circuit 107 may generate the control pulse CPUL and a mode input control signal MPIN on the basis of a control start signal CSTR, the mode register read command MRR, and the read input control signal RPIN. The control start signal CSTR may be activated to perform a mode control operation for controlling the point of time that the mode input control signal MPIN is generated, such that the mode input control signal MPIN and the read input control signal RPIN are generated at the same time or overlapping intervals of time. In different embodiments, the control start signal CSTR may be applied from the external device (not illustrated) of the semiconductor device 10, or generated in the semiconductor device 10 on the basis of the external control signal CA. When the mode register read command MRR is generated for the mode register read operation, the mode input control signal generation circuit 107 may generate the mode input control signal MPIN at the point of time that a mode delay period has elapsed from the point of time that the mode register read command MRR was generated. The mode input control signal generation circuit 107 may generate the control pulse CPUL when the control start signal CSTR is generated to perform the mode control operation, and may generate the mode input control signal MPIN at the point of time that the mode delay period has elapsed from the point of time that the control pulse CPUL was generated. The mode input control signal generation circuit 107 may generate a restart signal (RSTR of FIG. 2) at the point of time that a restart period has elapsed from the point of time that the mode input control signal MPIN was generated, when the mode input control signal MPIN is generated during the mode control operation. The mode input control signal generation circuit 107 may control the mode delay period when the restart signal RSTR is generated. The mode input control signal generation circuit 107 may sequentially increase the mode delay period by a unit delay period from the initial delay period, whenever the restart signal RSTR is generated. The initial delay period and the unit delay period may be set to various values in different embodiments. In different embodiments, the mode input control signal generation circuit 107 may be implemented to sequentially decrease the mode delay period by the unit delay period from the initial delay period, whenever the restart signal RSTR is generated. The mode input control signal generation circuit 107 may generate the control pulse CPUL when the restart signal RSTR of FIG. 2 is generated, and generate the mode input control signal MPIN at the point of time that the mode delay period has elapsed from the point of time that the control pulse CPUL was generated. The mode input control signal generation circuit 107 may repeatedly perform an operation of generating the control pulse CPUL and the mode input control signal MPIN, until the mode input control signal MPIN and the read input control signal RPIN are generated at the same time or overlapping intervals of time during the mode control operation. The mode input control signal generation circuit 107 may apply the control pulse CPUL to the read strobe signal generation circuit 103, and apply the mode input control signal MPIN to the mode register 109 and the read pipe circuit 111.

The mode register 109 may be coupled to the operation control circuit 101, the mode input control signal generation circuit 107, and the read pipe circuit 111. The mode register 109 may receive the mode register write command MRW and the information signal OP from the operation control circuit 101, and receive the mode input control signal MPIN from the mode input control signal generation circuit 107. The mode register 109 may receive and store the information signal OP when the mode register write command MRW is generated for the mode register write operation. The mode register 109 may output the stored information signal OP as the mode data MDA when the mode input control signal MPIN is generated. The mode register 109 may apply the mode data MDA to the read pipe circuit 111.

The read pipe circuit 111 may be coupled to the read delay circuit 105, the mode input control signal generation circuit 107, and the mode register 109. The read pipe circuit 111 may receive the read input control signal RPIN from the read delay circuit 105, receive the mode input control signal MPIN from the mode input control signal generation circuit 107, and receive the mode data MDA from the mode register 109. The read pipe circuit 111 may store the cell data CDA when the read input control signal RPIN is generated as the read operation or the mode control operation is performed. The read pipe circuit 111 may store the mode data MDA when the mode input control signal MPIN is generated as the mode register read operation or the mode control operation is performed.

FIG. 2 is a block diagram illustrating the configuration of a mode input control signal generation circuit 107A in accordance with an embodiment. As illustrated in FIG. 2, the mode input control signal generation circuit 107A may include a control period signal generation circuit (C_PD GEN) 121, a control pulse generation circuit (CPUL GEN) 123, a mode delay circuit (MDLY) 125, a restart signal generation circuit (RSTR GEN) 127, a delay select signal generation circuit (DSEL GEN) 129, and a control stop signal generation circuit (CSTOP GEN) 131.

The control period signal generation circuit 121 may be coupled to the control pulse generation circuit 123 and the control stop signal generation circuit 131. The control period signal generation circuit 121 may receive a control stop signal CSTOP from the control stop signal generation circuit 131. The control stop signal CSTOP may be generated when the mode input control signal MPIN and the read input control signal RPIN are generated at the same time or overlapping intervals of time. The control period signal generation circuit 121 may generate a control period signal C_PD which is activated in a period during which the mode control operation is performed, on the basis of the control start signal CSTR and the control stop signal CSTOP. The control period signal generation circuit 121 may activate the control period signal C_PD when the control start signal CSTR is generated, and deactivate the control period signal C_PD when the control stop signal CSTOP is generated.

The control pulse generation circuit 123 may be coupled to the control period signal generation circuit 121, the mode delay circuit 125, and the restart signal generation circuit 127. The control pulse generation circuit 123 may receive the control period signal C_PD from the control period signal generation circuit 121, and receive the restart signal RSTR from the restart signal generation circuit 127. The control pulse generation circuit 123 may generate the control pulse CPUL on the basis of the control start signal CSTR, the control period signal C_PD, and the restart signal RSTR. The control pulse generation circuit 123 may generate the control pulse CPUL when the control start signal CSTR is generated. The control pulse generation circuit 123 may generate the control pulse CPUL when the restart signal RSTR is generated while the control period signal C_PD is activated. The control pulse generation circuit 123 may apply the control pulse CPUL to the mode delay circuit 125.

The mode delay circuit 125 may be coupled to the control pulse generation circuit 123, the restart signal generation circuit 127, the delay select signal generation circuit 129, and the control stop signal generation circuit 131. The mode delay circuit 125 may receive the control pulse CPUL from the control pulse generation circuit 123, and receive a delay select signal DSEL from the delay select signal generation circuit 129. The mode delay circuit 125 may generate the mode input control signal MPIN from the control pulse CPUL and the mode register read command MRR on the basis of the delay select signal DSEL. The mode delay circuit 125 may generate the mode input control signal MPIN by delaying the control pulse CPUL by the mode delay period set on the basis of the delay select signal DSEL, during the mode control operation. The mode delay circuit 125 may generate the mode input control signal MPIN by delaying the mode register read command MRR by the mode delay period set on the basis of the delay select signal DSEL, during the mode register read operation. The mode delay circuit 125 may apply the mode input control signal MPIN to the restart signal generation circuit 127 and the control stop signal generation circuit 131.

The restart signal generation circuit 127 may be coupled to the mode delay circuit 125. The restart signal generation circuit 127 may receive the mode input control signal MPIN from the mode delay circuit 125. The restart signal generation circuit 127 may generate the restart signal RSTR on the basis of the mode input control signal MPIN. The restart signal generation circuit 127 may generate the restart signal RSTR by delaying the mode input control signal MPIN by a restart period (tdR of FIG. 4).

The delay select signal generation circuit 129 may be coupled to the mode delay circuit 125 and the restart signal generation circuit 127. The delay select signal generation circuit 129 may receive the restart signal RSTB from the restart signal generation circuit 127. The delay select signal generation circuit 129 may generate the delay select signal DSEL having a logic bit set to set the mode delay period to the initial delay period when the mode control operation is performed. The delay select signal generation circuit 129 may generate the delay select signal DSEL having a logic bit set that is sequentially changed to sequentially increase the mode delay period by the unit delay period from the initial delay period, whenever the restart signal RSTR is generated. For example, the delay select signal generation circuit 129 may generate the delay select signal DSEL having a first logic bit set to set the mode delay period to the initial delay period, when the mode control operation is performed, may generate the delay select signal DSEL having a second logic bit set to increase the mode delay period by the unit delay period from the initial delay period, when the restart signal RSTR is generated for the first time, and may generate the delay select signal DSEL having a third logic bit set to increase the mode delay period by two times the unit delay period from the initial delay period, when the restart signal RSTR is generated for the second time. The delay select signal generation circuit 129 may apply the delay select signal DSEL to the mode delay circuit 125. The delay select signal generation circuit 129 may be implemented as a counter, and sequentially change the logic bit set of the delay select signal DSEL by counting the restart signal RSTR.

The control stop signal generation circuit 131 may be coupled to the control period signal generation circuit 121 and the mode delay circuit 125. The control stop signal generation circuit 131 may receive the mode input control signal MPIN from the mode delay circuit 125. The control stop signal generation circuit 131 may generate the control stop signal CSTOP on the basis of the mode input control signal MPIN and the read input control signal RPIN. The control stop signal generation circuit 131 may generate the control stop signal CSTOP when the mode input control signal MPIN and the read input control signal RPIN are generated at the same time or overlapping intervals of time.

The control stop signal generation circuit 131 may apply the control stop signal CSTOP to the control period signal generation circuit 121.

Figure 3:
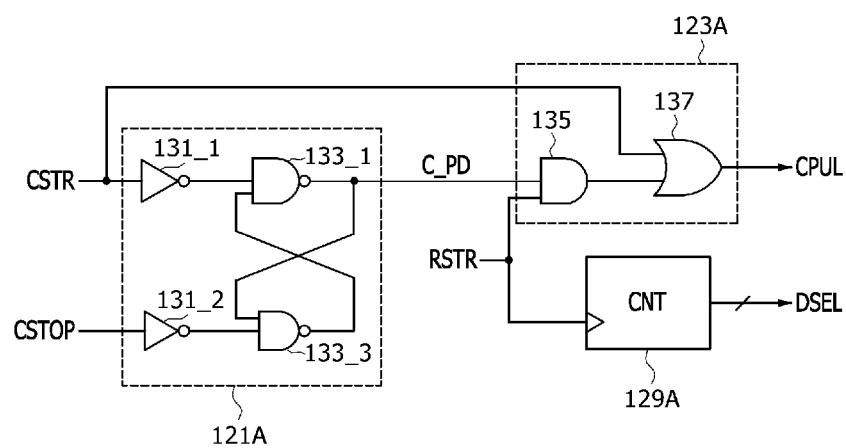
FIG. 3 is a circuit diagram illustrating a configuration based on examples of a control period signal generation circuit, a control pulse generation circuit, and a delay select signal generation circuit, which are included in the mode input control signal generation circuit.

FIG. 3 is a circuit diagram illustrating a control period signal generation circuit 121A, a control pulse generation circuit 123A, and a delay select signal generation circuit 129A in accordance with an embodiment.

As illustrated in FIG. 3, the control period signal generation circuit 121A may include inverters 131_1 and 131_2 and NAND gates 133_1 and 133_3. The inverter 131_1 may invert and buffer the control start signal CSTR, and output the inverted and buffered signal. The inverter 131_2 may invert and buffer the control stop signal CSTOP, and output the inverted and buffered signal. The NAND gate 133_1 may generate the control period signal C_PD by performing a NAND operation on the output signal of the inverter 131_1 and an output signal of the NAND gate 133_3. The NAND gate 133_3 may perform a NAND operation on the output signal of the inverter 131_2 and an output signal of the NAND gate 133_1. The control period signal generation circuit 121A may activate the control period signal C_PD to a logic high level when the control start signal CSTR is generated at a logic high level, and may deactivate the control period signal C_PD to a logic low level when the control stop signal CSTOP is generated at a logic high level.

As illustrated in FIG. 3, the control pulse generation circuit 123A may include an AND gate 135 and an OR gate 137. The AND gate 135 may perform an AND operation on the control period signal C_PD and the restart signal RSTR. The OR gate 137 may perform an OR operation on the control start signal CSTR and an output signal of the AND gate 135. The control pulse generation circuit 123A may generate the control pulse CPUL at a logic high level when the control start signal CSTR is generated at a logic high level for the mode control operation. The control pulse generation circuit 123A may generate the control pulse CPUL at a logic high level, when the restart signal RSTR is generated at a logic high level while the control period signal C_PD is activated to a logic high level as the mode control operation is performed.

As illustrated in FIG. 3, the delay select signal generation circuit 129A may be implemented as a counter. The delay select signal generation circuit 129A may be initialized to generate the delay select signal DSEL having a logic bit set to set the mode delay period to the initial delay period. The delay select signal generation circuit 129A may generate the delay select signal DSEL having a logic bit set that is sequentially changed to sequentially increase the mode delay period by the unit delay period from the initial delay period, whenever the restart signal RSTR is generated.

FIGS. 4 to 10 are diagrams for describing a mode control operation of the semiconductor device in accordance with an embodiment.

Figure 4:
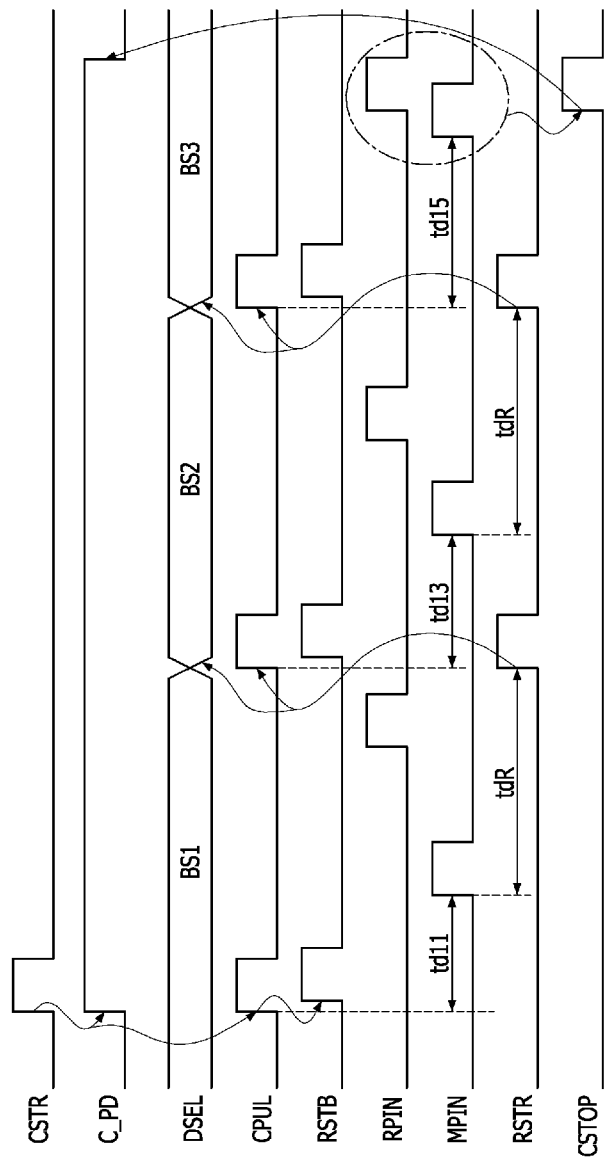
FIGS. 4, 5, 6, 7, 8, 9, 10 are diagrams for describing a mode control operation of the semiconductor device in accordance with the embodiment.
Figure 5:
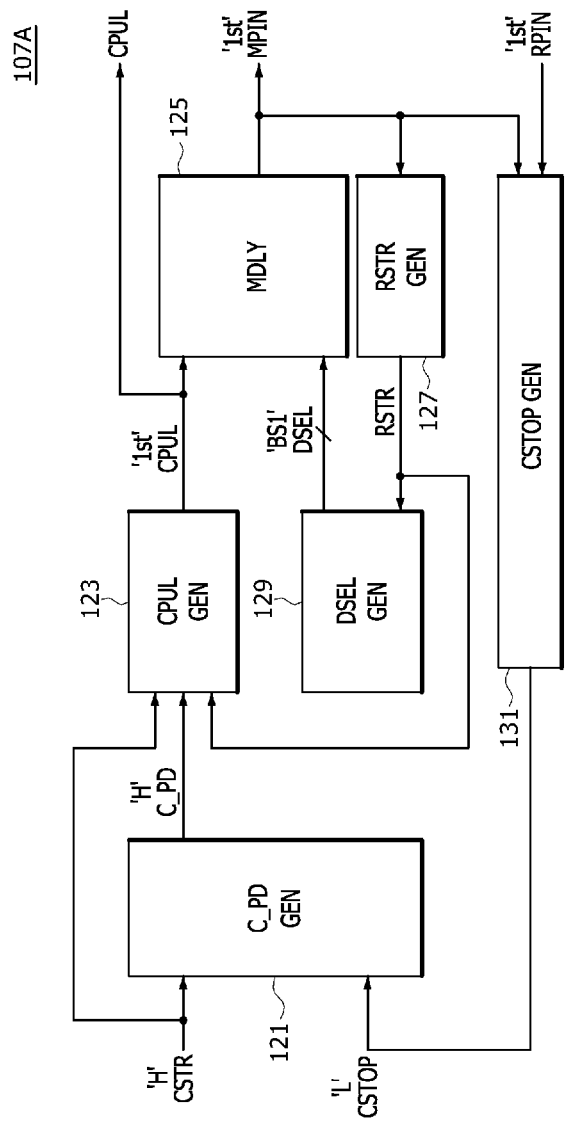
Figure 6:
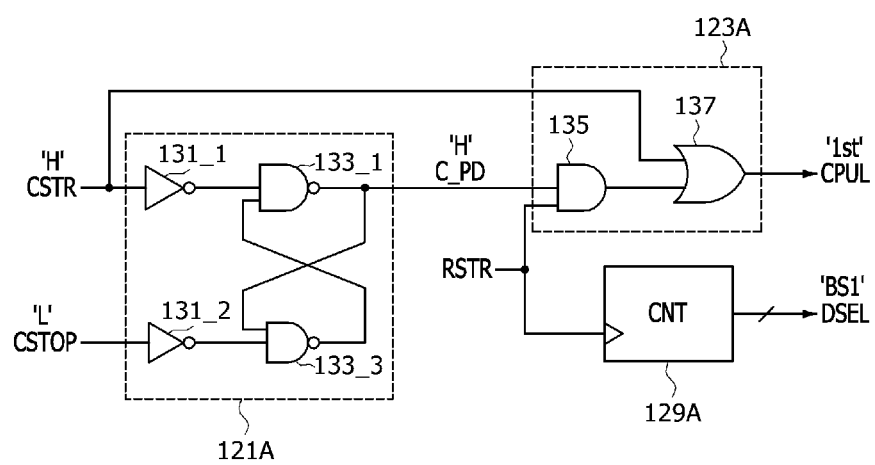

As illustrated in FIGS. 4 to 6, when the control start signal CSTR is generated, the control period signal C_PD may be activated to a logic high level, and a '1st' control pulse CPUL may be generated. The read strobe signal RSTB and the read input control signal RPIN may be sequentially generated by the '1st' control pulse CPUL. Since the delay select signal DSEL has been initialized to have a 1st logic bit set 'BS1', the mode delay period may be set to an initial delay period td11, and a '1st' mode input control signal MPIN may be generated by delaying the '1st' control pulse CPUL by the mode delay period td11. Since the read input control signal RPIN and the mode input control signal MPIN were not generated at the same time or overlapping intervals of time, the control stop signal CSTOP might not be generated but retain a logic low level 'L.'

Figure 7:
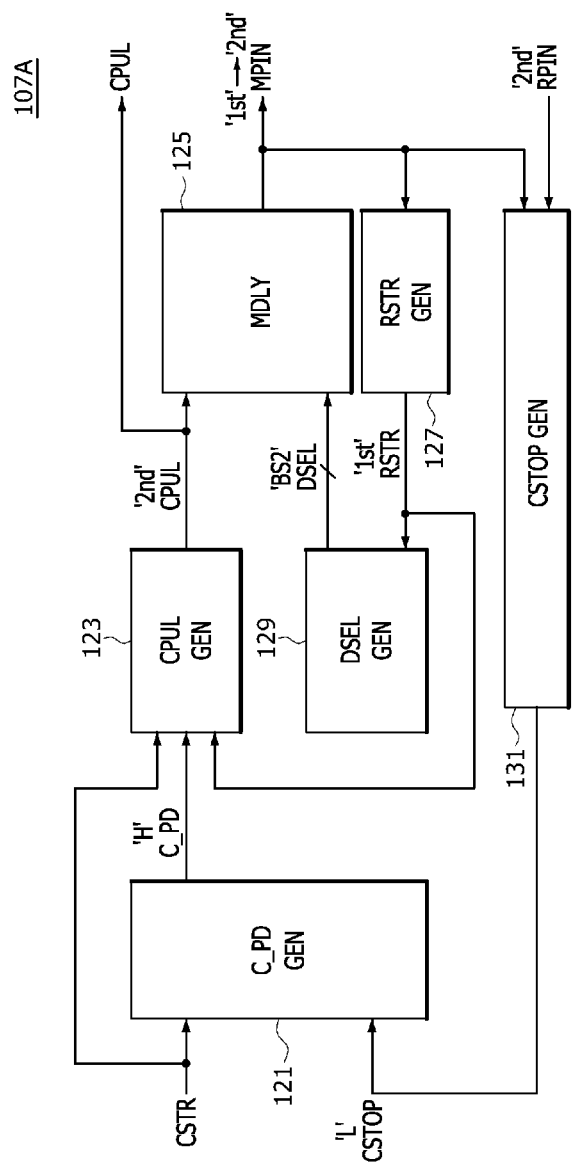
Figure 8:
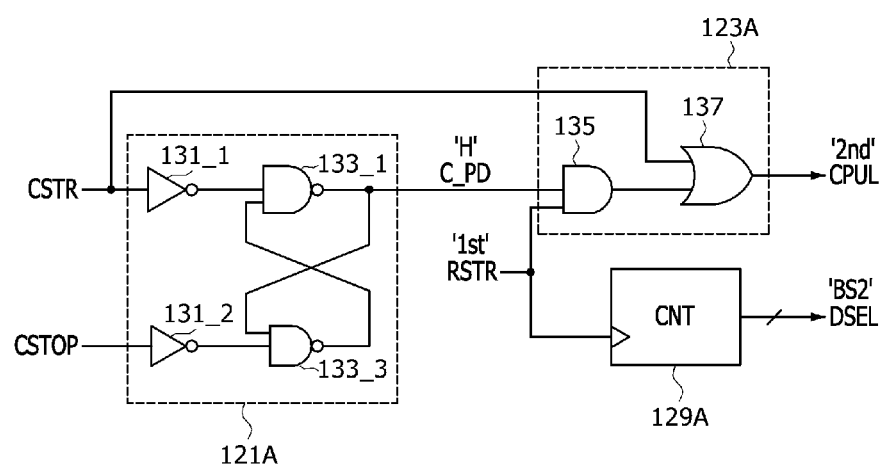

As illustrated in FIGS. 4, 7, and 8, when the '1st' mode input control signal MPIN is generated, a '1st' restart signal RSTR may be generated at the point of time that the restart period tdR has elapsed. When the '1st' restart signal RSTR is generated, the delay select signal DSEL may be controlled to have a 2nd logic bit set 'BS2', and a '2nd' control pulse CPUL may be generated. The read strobe signal RSTB and the read input control signal RPIN may be sequentially generated by the '2nd' control pulse CPUL. Since the delay select signal DSEL is set to the 2nd logic bit set 'BS2', the mode delay period may be set to a period td13 increased by the unit delay period from the initial delay period, and a '2nd' mode input control signal MPIN may be generated by delaying the '2nd' control pulse CPUL by the mode delay period td13. Since the read input control signal RPIN and the mode input control signal MPIN were not generated at the same time or overlapping intervals of time, the control stop signal CSTOP might not be generated but retain a logic low level 'L'.

Figure 9:
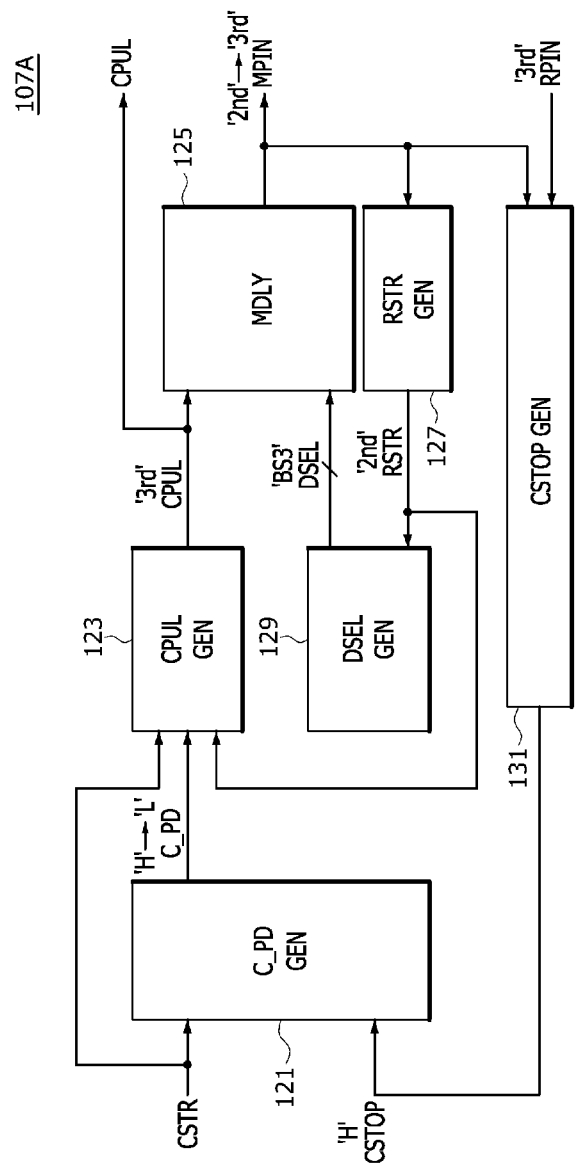
Figure 10:
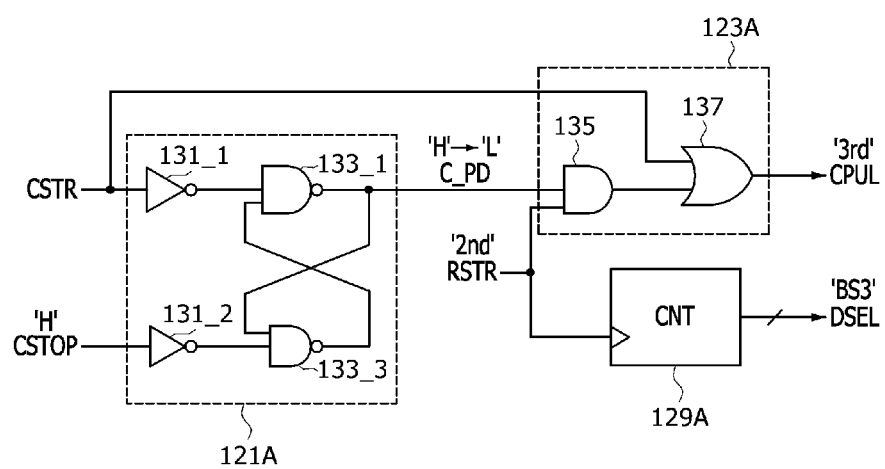

As illustrated in FIGS. 4, 9, and 10, when the '2nd' mode input control signal MPIN is generated, a '2nd' restart signal RSTR may be generated at the point of time that the restart period tdR has elapsed. When the '2nd' restart signal RSTR is generated, the delay select signal DSEL may be controlled to have a 3rd logic bit set 'BS3', and a '3rd' control pulse CPUL may be generated. The read strobe signal RSTB and the read input control signal RPIN may be sequentially generated by the '3rd' control pulse CPUL. Since the delay select signal DSEL is set to the 3rd logic bit set 'BS3', the mode delay period may be set to a period td15 increased by two times the unit delay period from the initial delay period, and a '3rd' mode input control signal MPIN may be generated by delaying the '3rd' control pulse CPUL by a mode delay time td15. Since the read input control signal RPIN and the mode input control signal MPIN were generated at the same time or overlapping intervals of time, the control stop signal CSTOP may be generated at a logic high level 'H', and the control period signal C_PD may be deactivated to a logic low level 'L.' Then, the mode control operation may be ended. In an embodiment, the phrase 'same time' as used herein with respect to signals means that the signals take place on overlapping intervals of time. For example, if a read input control signal RPIN takes palace over a first interval of time and a mode input control signal MPIN takes place at the same time over a second interval of time, then the first and second intervals at least partially overlap each other such that there exists a time at which the read input control signal RPIN and mode input control signal MPIN signals are both taking place.

As described above, the semiconductor device 10 in accordance with the present embodiment may provide the mode control operation of controlling the point of time that the mode input control signal MPIN is generated, such that the mode input control signal MPIN and the read input control signal RPIN are generated at the same time or overlapping intervals of time. Therefore, in an embodiment, the semiconductor device 10 may reduce the difference between the point of time that the cell data CDA is input to the read pipe circuit 111 during the read operation and the point of time that the mode data MDA is input to the read pipe circuit 111 during the mode register operation, thereby providing convenience in circuit design, and minimizing a malfunction.

Figure 11:
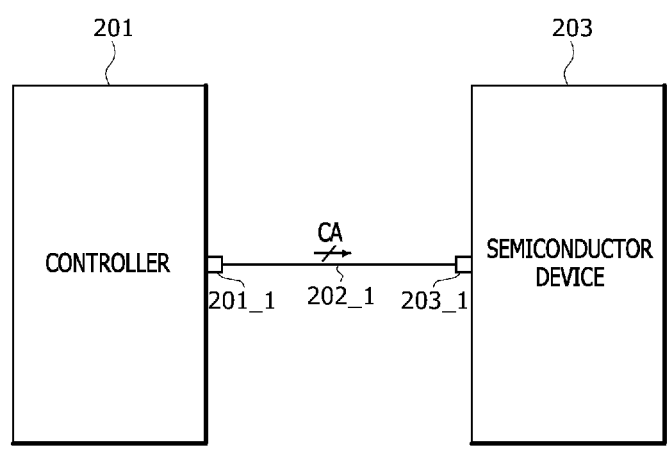
FIGS. 11 and 12 are block diagrams illustrating the configuration of a semiconductor system in accordance with an embodiment.

FIG. 11 is a block diagram illustrating the configuration of a semiconductor system 200 in accordance with an embodiment. As illustrated in FIG. 11, the semiconductor system 200 may include a controller 201 and a semiconductor device 203.

The controller 201 may include a control pin 201_1. The semiconductor device 203 may include a device pin 203_1. The controller 201 may transmit the external control signal CA to the semiconductor device 203 through a transmission line 202_1 coupled between the control pin 201_1 and the device pin 203_1. The first control pin 201_1, the first transmission lines 202_1, and the first device pin 203_1 may be each implemented as a plurality of pins or lines according to the number of bits contained in the external control signal CA.

The semiconductor device 203 may provide a mod control operation capable of controlling the point of time that the mode input control signal MPIN is generated, such that the mode input control signal MPIN and the read input control signal RPIN are generated at the same time or overlapping intervals of time. The semiconductor device 203 may be implemented as the semiconductor device 10 illustrated in FIG. 1.

Figure 12:
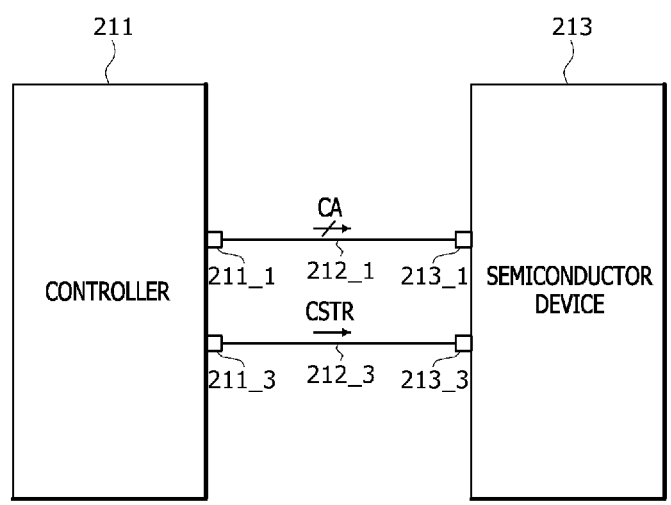

FIG. 12 is a block diagram illustrating the configuration of a semiconductor system 210 in accordance with an embodiment. As illustrated in FIG. 12, the semiconductor system 210 may include a controller 211 and a semiconductor device 213.

The controller 211 may include a first control pin 211_1 and a second control pin 211_3. The semiconductor device 213 may include a first device pin 213_1 and a second device pin 213_3. The controller 211 may transmit the external control signal CA to the semiconductor device 213 through a first transmission line 212_1 coupled between the first control pin 211_1 and the first device pin 213_1. The controller 211 may transmit the control start signal CSTR to the semiconductor device 213 through a second transmission line 212_3 coupled between the second control pin 211_3 and the second device pin 213_3.

The semiconductor device 213 may provide a mode control operation capable of controlling the point of time that the mode input control signal MPIN is generated, such that the mode input control signal MPIN and the read input control signal RPIN are generated at the same time or overlapping intervals of time, on the basis of the control start signal CSTR. The semiconductor device 213 may be implemented as the semiconductor device 10 illustrated in FIG. 1.

The semiconductor device 10 described with reference to FIG. 1 may be applied to an electronic system including a memory system, a graphic system, a computing system, a mobile system and the like. For example, referring to FIG. 13, an electronic system 1000 in accordance with an embodiment may include a data storage unit 1001, a memory controller 1002, a buffer memory 1003, and an input/output interface 1004.

According to a control signal from the memory controller 1002, the data storage unit 1001 stores data applied from the memory controller 1002, reads the stored data, and outputs the read data to the memory controller 1002. The data storage unit 1001 may include nonvolatile memory capable of continuously retaining data stored therein even though power supply is cut off. The nonvolatile memory may be implemented as flash memory (NOR flash memory or NAND flash memory), PRAM (Phase Change Random Access Memory), RRAM (Resistive Random Access Memory), STTRAM (Spin Transfer Torque Random Access Memory), or MRAM (Magnetic Random Access Memory).

Figure 13:
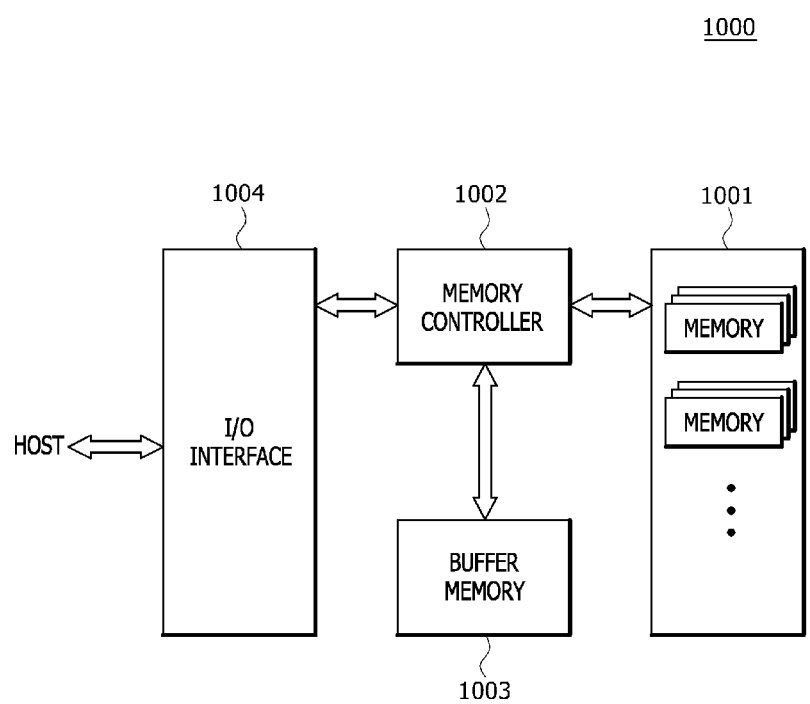
FIGS. 13 and 14 are block diagrams illustrating the configuration of an electronic system in accordance with an embodiment.

The memory controller 1002 decodes a command applied from an external device (host device) through the input/output interface 1004, and controls a data input/output operation on the data storage unit 1001 and the buffer memory 1003 according to the decoding result. FIG. 13 illustrates the memory controller 1002 as one block. However, the memory controller 1002 may separately include a controller for controlling the data storage unit 1001 and a controller for controlling the buffer memory 1003 serving as volatile memory.

The buffer memory 1003 may temporarily store data to be processed by the memory controller 1002, i.e. data input to/output from the data storage unit 1001. The buffer memory 1003 may store data DATA applied from the memory controller 1002 according to a control signal. The buffer memory 1003 reads the data stored therein and outputs the read data to the memory controller 1002. The buffer memory 1003 may include volatile memory such as DRAM (Dynamic Random Access Memory), mobile DRAM, or SRAM (Static Random Access Memory). The buffer memory 1003 may include the semiconductor device 10 illustrated in FIG. 1.

The input/output interface 1004 may provide a physical connection between the memory controller 1002 and an external device (host), such that the memory controller 1002 can receive the control signal for data input to/data output from the external device and exchange data with the external device. The input/output interface 1004 may include one of various interface protocols such as USB (Universal Serial Bus), MMC (Multi-Media Card), PCI-E (Peripheral Component Interconnect-Express), SAS (Serial Attached Small Computer System Interface), SATA (Serial Advanced Technology Attachment), PATA (Parallel ATA), SCSI (Small Computer System Interface), ESDI (Enhanced Small Device Interface), and IDE (Integrated Drive Electronics).

The electronic system 1000 may be used as a secondary memory device or external storage device of the host device. Examples of the electronic system 1000 may include an SSD (Solid State Disk), USB (Universal Serial Bus) memory, an SD (Secure Digital) card, an mSD (mini Secure Digital) card, a micro SD card, an SDHC (Secure Digital High Capacity) card, a memory stick card, an SM (Smart Media) card, an MMC (Multi-Media Card), an eMMC (embedded MMC), a CF (Compact Flash) card and the like.

Figure 14:
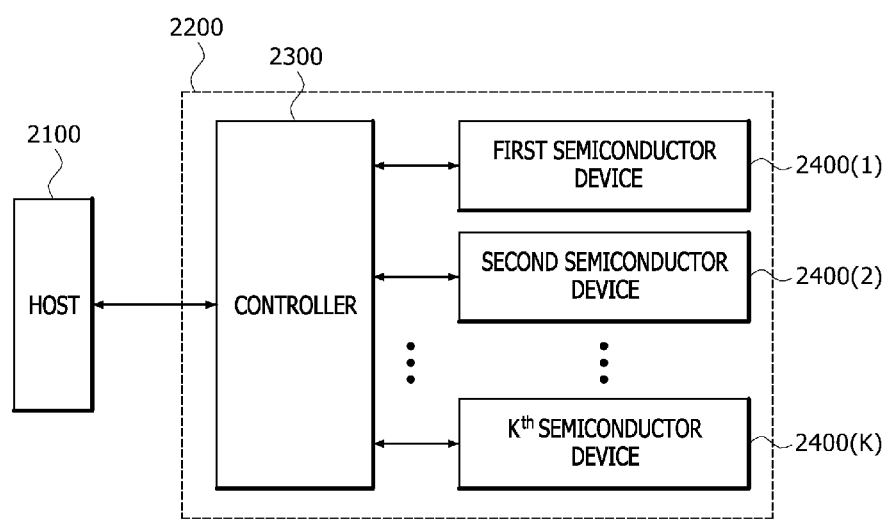

FIG. 14 is a block diagram illustrating the configuration of an electronic system 2000 in accordance with another embodiment. As illustrated in FIG. 14, the electronic system 2000 may include a host 2100 and a semiconductor system 2200.

The host 2100 and the semiconductor system 2200 may transmit/receive signals to/from each other by using an interface protocol. Examples of the interface protocol used between the host 2100 and the semiconductor system 2200 may include an MMC (Multi-Media Card), ESDI (Enhanced Small Disk Interface), IDE (Integrated Drive Electronics), PCI-E (Peripheral Component Interconnect-Express), ATA (Advanced Technology Attachment), SATA (Serial ATA), PATA (Parallel ATA), SAS (Serial Attached SCSI), USB (Universal Serial Bus) and the like.

The semiconductor system 2200 may include a controller 2300 and semiconductor devices 2400(K:1). The controller 2300 may control the semiconductor devices 2400(K:1) to perform an active operation, a read operation, a write operation, a mode register write operation, and a mode register read operation. The semiconductor devices 2400(K:1) may each provide a mode control operation capable of controlling the point of time that the mode input control signal MPIN is generated, such that the mode input control signal MPIN and the read input control signal RPIN are generated at the same time or overlapping intervals of time. Each of the semiconductor devices 2400(K:1) may include the semiconductor device 10 illustrated in FIG. 1.

Each of the semiconductor devices 2400(K:1) may be implemented as the semiconductor device 10 described above with reference to FIG. 1. Each of the semiconductor devices 2400(K:1) may be implemented with one of DRAM (dynamic random access memory), PRAM (Phase change Random Access Memory), RRAM (Resistive Random Access Memory), MRAM (Magnetic Random Access Memory), and FRAM (Ferroelectric Random Access Memory).

Although some embodiments of the present teachings have been disclosed for illustrative purposes, those skilled in the art will appreciate that various modifications, additions and substitutions are possible, without departing from the scope and spirit of the present teachings as defined in the accompanying claims.

What is claimed is:

1. A semiconductor device comprising:
a mode input control signal generation circuit configured to:
generate a control pulse when a mode control operation is performed,
generate a mode input control signal by delaying the control pulse by a mode delay period, and
control the mode delay period on the basis of a restart signal which is generated at a point of time that a restart period has elapsed from a point of time that the mode input control signal was generated;
a read strobe signal generation circuit configured to generate a read strobe signal on the basis of the control pulse;
a read delay circuit configured to generate a read input control signal by delaying the read strobe signal by a read delay period; and
a read pipe circuit configured to receive mode data on the basis of the mode input control signal, and receive cell data on the basis of the read input control signal.

2. The semiconductor device of claim 1, wherein the mode input control signal generation circuit comprises a control period signal generation circuit,
wherein the control period signal generation circuit is configured to generate a control period signal which is activated during a period in which the mode control operation is performed, on the basis of a control start signal and a control stop signal.

3. The semiconductor device of claim 2, wherein the control period signal generation circuit is configured to receive the control start signal generated on the basis of an external control signal, or receive the control start signal applied from an external device.

4. The semiconductor device of claim 1, wherein the mode input control signal generation circuit further comprises a control stop signal generation circuit,
wherein the control stop signal generation circuit is configured to generate the control stop signal when the mode input control signal and the read input control signal are generated at the same time or overlapping intervals of time.

5. The semiconductor device of claim 1, wherein the mode input control signal generation circuit comprises a control pulse generation circuit,
wherein the control pulse generation circuit is configured to generate the control pulse when a control start signal is generated or the restart signal is generated.

6. The semiconductor device of claim 1, wherein the mode input control signal generation circuit comprises a mode delay circuit,
wherein the mode delay circuit is configured to set the mode delay period on the basis of a delay select signal, and generate the mode input control signal by delaying the control pulse by the mode delay period.

7. The semiconductor device of claim 6, wherein the mode input control signal generation circuit further comprises a delay select signal generation circuit,
wherein the delay select signal generation circuit is configured to generate the delay select signal to set the mode delay period to an initial delay period, when the mode control operation is performed, and generate the delay select signal to sequentially increase the mode delay period by a unit delay period from the initial delay period, whenever the restart signal is generated.

8. The semiconductor device of claim 6, wherein the mode input control signal generation circuit further comprises a delay select signal generation circuit,
wherein the delay select signal generation circuit is configured to generate the delay select signal to set the mode delay period to an initial delay period, when the mode control operation is performed, and generate the delay select signal to sequentially decrease the mode delay period by a unit delay period from the initial delay period, whenever the restart signal is generated.

9. The semiconductor device of claim 6, wherein the mode delay circuit is configured to generate the mode input control signal by delaying a mode register read command by the mode delay period, when a mode register read operation is performed.

10. The semiconductor device of claim 1, further comprising a mode register configured to output the mode data on the basis of the mode input control signal.

11. A semiconductor device comprising:
a control pulse generation circuit configured to generate a control pulse when a mode control operation is performed;
a mode delay circuit configured to set a mode delay period on the basis of a delay select signal, and generate a mode input control signal by delaying the control pulse by the mode delay period;
a read strobe signal generation circuit configured to generate a read strobe signal on the basis of the control pulse;
a read delay circuit configured to generate a read input control signal by delaying the read strobe signal by a read delay period; and
a read pipe circuit configured to receive mode data on the basis of the mode input control signal, and receive cell data on the basis of the read input control signal.

12. The semiconductor device of claim 11, further comprising a restart signal generation circuit configured to generate a restart signal at a point of time that a restart period has elapsed from a point of time that the mode input control signal was generated.

13. The semiconductor device of claim 12, wherein the control pulse generation circuit is configured to generate the control pulse when the restart signal is generated.

14. The semiconductor device of claim 12, further comprising a delay select signal generation circuit,
wherein the delay select signal generation circuit is configured to generate the delay select signal to set the mode delay period to an initial delay period, when the mode control operation is performed, and generate the delay select signal to sequentially increase the mode delay period by a unit delay period from the initial delay period, whenever the restart signal is generated.

15. The semiconductor device of claim 12, further comprising a delay select signal generation circuit, wherein the delay select signal generation circuit is configured to generate the delay select signal to set the mode delay period to an initial delay period, when the mode control operation is performed, and generate the delay select signal to sequentially decrease the mode delay period by a unit delay period from the initial delay period, whenever the restart signal is generated.

16. The semiconductor device of claim 11, further comprising a control period signal generation circuit configured to generate a control period signal which is activated during a period in which the mode control operation is performed, on the basis of a control start signal and a control stop signal.

17. The semiconductor device of claim 16, wherein the control period signal generation circuit is configured to receive the control start signal generated on the basis of an external control signal, or receive the control start signal applied from an external device.

18. The semiconductor device of claim 16, further comprising a control stop signal generation circuit configured to generate the control stop signal when the mode input control signal and the read input control signal are generated at the same time or overlapping intervals of time.

\* \* \* \* \*